US005113968A

United States Patent [19]

Lemmon

[11] Patent Number: 5,113,968

[45] Date of Patent: May 19, 1992

[54] SPEAKER GRILL ASSEMBLY

[76] Inventor: Harold J. Lemmon, 9884 Monroe Dr., Dallas, Tex. 75220

[21] Appl. No.: 592,708

[22] Filed: Oct. 3, 1990

[51] Int. Cl.[5] .............................................. H05K 5/00

[52] U.S. Cl. .................................. 181/148; 181/150; 181/199

[58] Field of Search ............................... 181/144-156, 181/199

[56] References Cited

U.S. PATENT DOCUMENTS 4,439,643 3/1984 Schzeizer ........................ 181/153 X 4,799,264 1/1989 Plummer ......................... 181/145 X 4,887,690 12/1989 Patel .................................. 181/150

*Primary Examiner*—L. T. Hix

*Assistant Examiner*—Khanh Dang

*Attorney, Agent, or Firm*—Harry C. Post, III

[57] ABSTRACT

A speaker grill assembly, which comprises a grill constructed to support a speaker on a wall. The grill includes a body having an opening through which the speaker emits sounds and a passageway through which the body may be connected to the wall. A perforated screen constructed to cover the opening and passageway in the body of said grill detachably is connected to the grill. A pad is constructed to prevent viewing the opening and passageway in the body of the grill while permitting the sound emitted by the speaker to pass substantially unimpaired therethrough. The pad is disposed between the grill and the perforated screen when the grill and the preforated screen are fastened to one another.

5 Claims, 2 Drawing Sheets

SPEAKER GRILL ASSEMBLY

Figure 1:
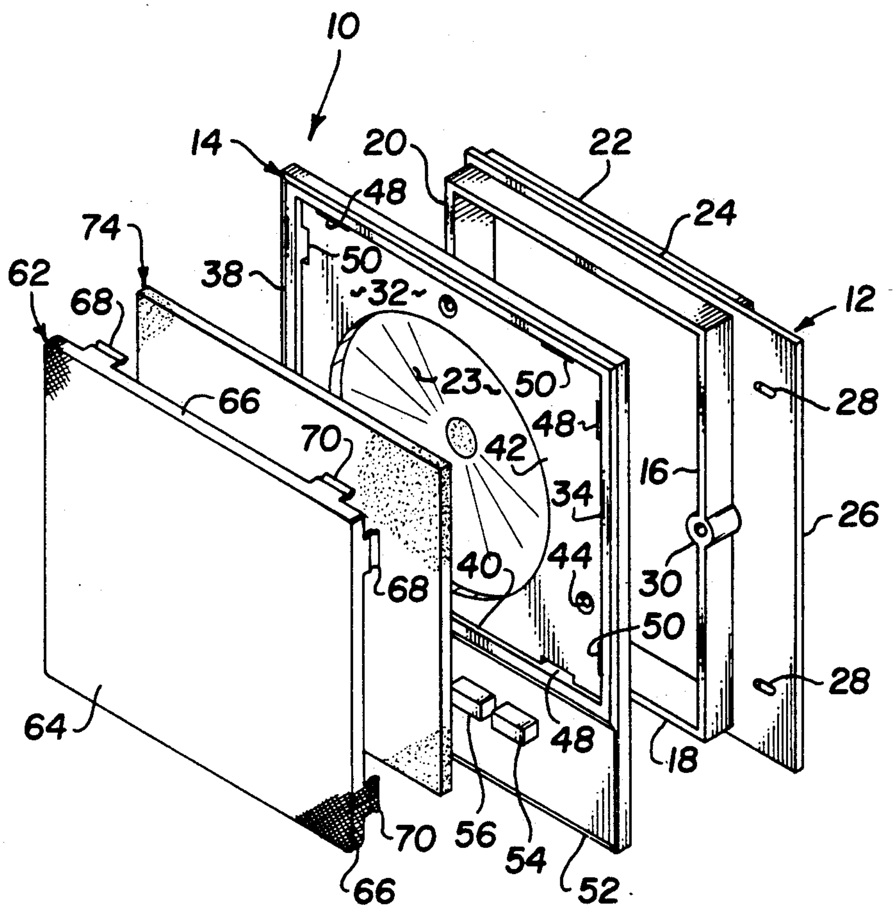

It is well known that a loudspeaker may be mounted to a wall of a room to reproduce the amplified sound from radio stations, tape players, record players, and voice communications between other speakers in other rooms for intercommunication.

The loudspeaker is normally mounted to a grill. The grill is a thin walled body in the shape of a square, rectangle or circle made from metal, but more often from a plastic material. Screws are used to attach the grill to the wall surface on a mounting frame. An opening is provided through the body of the grill so that the speaker can emit sound. This opening most often consists of horizontal parallel elements or louvers extending across the opening to allow the sound to pass through while protecting the speaker from damage. Although the louvers slightly restrict the passage of sound, they hide the speaker from view and protect the speaker from damage.

A problem with this prior art design is that the aesthetics of the room are adversely affected because the speaker is partially visible through the louvers, the screw heads that secure the grill to the wall or mounting ring are visible, and the color selection of the grill is restricted to the color of the plastic material used to make the grill.

Accordingly, it is an object of the present invention to provide speaker grill assembly that does not adversely affect the aesthetics of the decor of a room in which it is mounted and to provide the user with multiple opportunities to change the color.

Further, it is an object of the present invention to provide a speaker grill assembly that eliminates all visibility of the screws that secure the grill assembly to the wall or mounting ring while allowing the speaker assembly to be removed from the wall or mounting ring for repair, color change or service at some future date, if necessary.

In accordance with the present invention, there is provided a speaker grill assembly, which comprises a grill constructed to support a speaker on a wall. The grill has a body with an opening through which the speaker emits sounds and a passageway through which the body may be connected to the wall. A perforated screen constructed to cover the opening and passageway in the body of the grill is detachably connected to the grill. A pad is constructed to prevent viewing the speaker and passageway in the body of the grill while permitting the sound emitted by the speaker to pass substantially unimpaired therethrough. The pad is disposed between the grill and the perforated screen when the grill and the perforated screen are fastened to one another.

Figure 3:
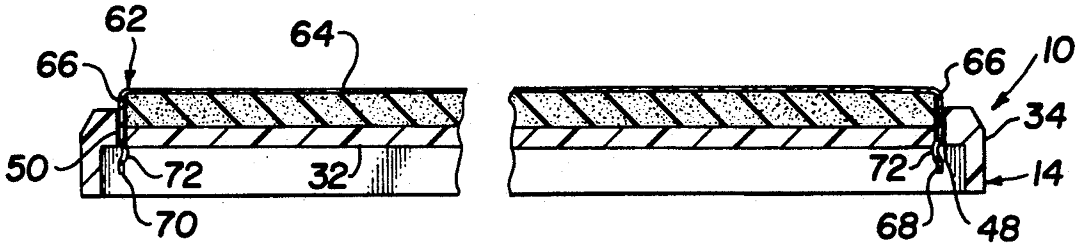
Figure 2:
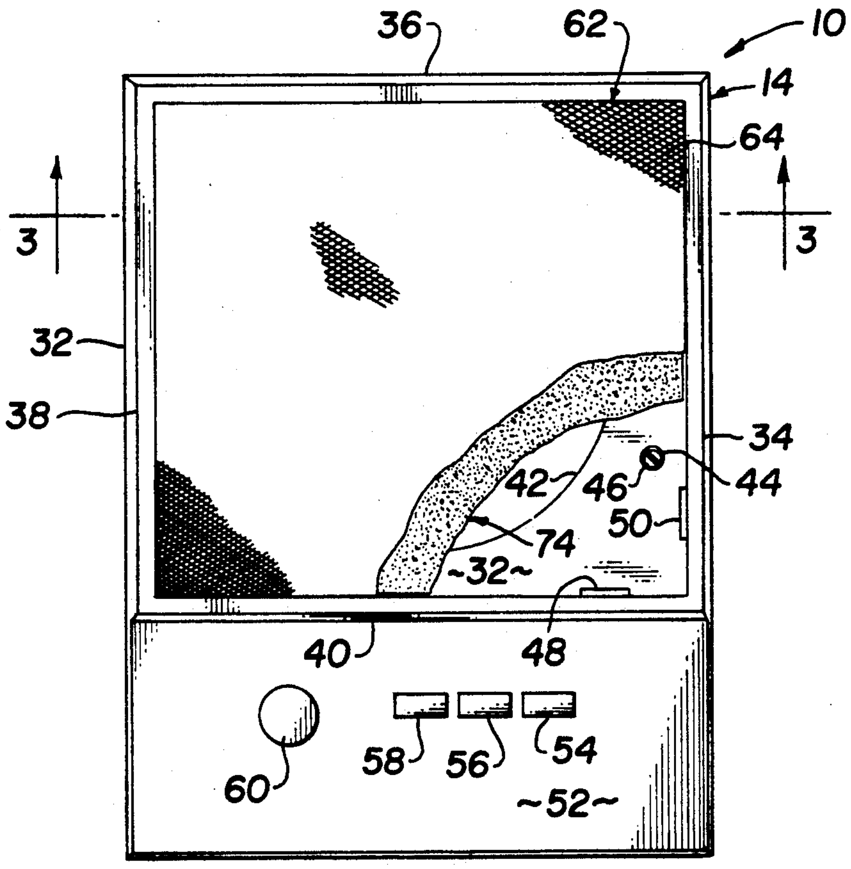

Other objects and advantages of the invention will become apparent upon reading the following detailed description and upon reference to the drawings, wherein like reference characters are used throughout to designate like parts:

FIG. 1 is a perspective view of the component parts of a speaker grill assembly constructed in accordance with the present invention;

FIG. 2 is a front elevational view, partly in section, of a speaker grill assembly constructed in accordance with the present invention, which is assembled from the component parts shown in FIG. 1; and FIG. 3 is a cross-sectional view of a speaker grill assembly constructed in accordance with the present invention and taken in the direction of the arrows and along the lines 3—3 of the invention shown in FIG. 2.

Turning now to the drawings, there is shown a speaker grill assembly 10 constructed according to the present invention.

Speaker grill assembly 10 may include a mounting bracket 12 for mounting a grill 14 on to a wall. Bracket 12 is of conventional construction having four walls 16, 18, 20 and 22. Walls 18, 20 and 22 are circumscribed by extension 24 disposed substantially equidistant between the edges of the respective wall. A tab 26 extends along wall 16 to interconnect extension 24 and extends away from wall 16 by a distance sufficient to mount bracket 12 to the wall and to provide two wall mounting slots 28. Two screw mounting brackets 30 are provided in walls 16 and 20 between walls 18 and 22 for receiving screws to connect a loudspeaker 23 and grill 14. If desired, another bracket, similar to brackets 30, could be provided in wall 22 between walls 16 and 20.

Grill 14 is constructed to support the speaker on the wall and includes a thin walled, rectangularly shaped body 32 surrounded by a support shoulder 34, 36, 38 and 40. Extending through body 32 are an oval opening 42 through which the speaker emits sounds and least two passageways 44 through which body 32 may be connected to the wall or to brackets 30 on mounting bracket 12 by screws 46. Extending through body 32 are two slots 48 and 50 provided near the extreme ends and adjacent to shoulders 34, 36, 38 and 40. An extension 52 is disposed along shoulder 40 to extend away from body 32. A series of openings may be provided in extension 52 to receive control knobs and buttons 54, 56, 58 and 60 for loudspeaker 23 mounted to body 32.

A perforated screen 62 has a relatively flat, rectangular front portion 64 constructed to cover opening 42 and passageways 44 in body 32 of grill 14. Extending along each edge of the rectangle formed by front portion 64 is an elongated lip 66 to provide an enclosure against body 32 and over opening 42. A tab 68 and 70 provided at each end to lip 66 to be complimentarily received within slots 48 and 50, respectively, of body 32. A shoulder 72 is disposed on tabs 68 and 70 to engage body 32 of grill 14 and thereby detachably connect perforated screen 62 to grill 14. Shoulder 72 is tapered on both sides of tab 68 or 70 to position it centrally in its respective slot when perforated screen 62 is selectively moved toward and away from body 32 of grill 14.

A generally rectangular foam pad 74 is constructed to prevent viewing opening 42 and passageways 44 in body 32 of grill 14 while permitting the sound emitted by the speaker to pass substantially unimpaired therethrough. Pad 74 is disposed between grill 14 and perforated screen 62 after grill 14 and perforated screen 62 are fastened to one another.

After a speaker grill assembly 10, constructed according to the present invention, has been mounted to the wall of a room in a home or other building, perforated screen 62 and pad 74 will prevent a viewer from seeing the speaker and screws 46 that secure grill 14 to the wall. After assembly, screen 62 may be removed from grill 14 and painted a color so as to agree with the aesthetics of the room and reassembled with grill 14 without using hand tools. Further, perforated screen 62 may be removed and reassembled from grill 14 without using any hand tools to clean the speaker or repaint the screen should the room be redecorated.

The invention having been described, what is claimed is:

1. A speaker grill assembly, comprising: a grill constructed to support a speaker on a wall, said grill including a body having an opening through which the speaker emits sounds and a passageway through which the body may be connected to the wall; a perforated screen constructed to cover the opening and passageway in the body of said grill detachably connected to said grill; and a pad being constructed to prevent viewing the opening and the passageway in the body of said grill while permitting the sound emitted by the speaker to pass substantially unimpaired therethrough, said pad being disposed between said grill and said perforated screen when said grill and said perforated screen are fastened to one another.

2. A speaker grill assembly as set forth in claim 1, further comprising: said perforated screen including fastening means for detachably connecting said perforated screen to said grill.

3. A speaker grill assembly as set forth in claim 1, further comprising: the body of said grill further having a slot; and said perforated screen including a front portion, a tab connected to the front portion and disposed to be complementarily received within the slot of the body of said grill and a shoulder disposed on the tab to engage the body of said grill and thereby detachably connect said perforated screen to said grill.

4. A speaker grill assembly as set forth in claim 3, further comprising: the body of said grill further having a thickness; and the shoulder of said perforated screen being disposed away from the front portion toward an outboard end of the tab by a distance at least as great as the thickness of the body of said grill and having a tapered portion to gradually urge the outboard end of the tab away from a side of the body of said grill when the tab is selectively moved into and out of the slot.

5. A speaker grill assembly, comprising: a grill constructed to support a speaker on a wall, said grill including a body having a thickness, an opening through which the speaker emits sounds, a passageway through which the body may be connected to the wall and a slot; a perforated screen constructed to cover the opening and passageway in the body of said grill detachably connected to said grill, said perforated screen including a front portion, a tab connected to the front portion and disposed to be complementarily received within the slot of the body of said grill and a shoulder disposed on the tab to engage the body of said grill and thereby detachably connect said perforated screen to said grill, the shoulder being disposed away from the front portion toward an outboard end of the tab by a distance at least as great as the thickness of the body of said grill and having a tapered portion to gradually urge the outboard end of the tab away from a side of the body of said grill when the tab is selectively moved into and out of the slot; and a pad constructed to prevent viewing the passages in the body of said grill while permitting the sound emitted by the speaker to pass substantially unimpaired therethrough, said pad being disposed between said grill and said perforated screen when said grill and said perforated screen are fastened to one another.

* * * * *